United States Patent
Alford

(10) Patent No.: US 7,411,474 B2
(45) Date of Patent: Aug. 12, 2008

(54) PRINTED WIRING BOARD ASSEMBLY WITH SELF-COMPENSATING GROUND VIA AND CURRENT DIVERTING CUTOUT

(75) Inventor: James L. Alford, Somerset, NJ (US)

(73) Assignee: Andrew Corporation, West Chester, IL (US)

( * ) Notice: Subject to any disclaimer, the term of this patent is extended or adjusted under 35 U.S.C. 154(b) by 60 days.

(21) Appl. No.: 11/247,449

(22) Filed: Oct. 11, 2005

(65) Prior Publication Data

US 2007/0080760 A1 Apr. 12, 2007

(51) Int. Cl.
*H01P 1/203* (2006.01)
(52) U.S. Cl. .................... 333/204; 333/219
(58) Field of Classification Search .......... 333/204, 333/219
See application file for complete search history.

(56) References Cited

U.S. PATENT DOCUMENTS

| | | | |
|---|---|---|---|
| 3,436,819 A | 4/1969 | Lunine | |
| 4,208,783 A | 6/1980 | Luther | |
| 4,510,446 A | 4/1985 | Braun | |
| 4,523,162 A | 6/1985 | Johnson | |
| 4,787,853 A | 11/1988 | Igarashi | |
| 4,800,348 A | 1/1989 | Rosar | |
| 4,963,843 A * | 10/1990 | Peckham | 333/203 |
| 5,075,650 A | 12/1991 | Okamura | |
| 5,192,926 A | 3/1993 | Sogo | |
| 5,315,069 A | 5/1994 | Gebara | |
| 5,369,491 A | 11/1994 | Schneider | |
| 5,377,404 A | 1/1995 | Berg | |
| 5,420,378 A | 5/1995 | Estes | |
| 5,461,352 A | 10/1995 | Noguchi | |
| 5,619,791 A | 4/1997 | Lambrecht, Jr. et al. | |
| 5,779,836 A | 7/1998 | Kerrick | |
| 5,812,037 A * | 9/1998 | Block | 333/204 |
| 5,841,975 A | 11/1998 | Layne | |
| 5,977,850 A | 11/1999 | Chaturvedi | |
| 5,994,978 A | 11/1999 | Vangala | |
| 6,232,559 B1 | 5/2001 | Janecek | |
| 6,255,602 B1 | 7/2001 | Evans | |
| 6,362,973 B1 | 3/2002 | Leddige | |
| 6,377,141 B1 * | 4/2002 | Hirabayashi | 333/204 |
| 6,395,582 B1 | 5/2002 | Sohn | |
| 6,535,083 B1 | 3/2003 | Hageman | |
| 6,663,442 B1 | 12/2003 | Helster | |
| 6,668,448 B2 | 12/2003 | Ross | |
| 6,675,473 B2 | 1/2004 | Ross | |
| 6,738,598 B2 | 5/2004 | Wu | |
| 6,807,065 B2 | 10/2004 | Sato | |

(Continued)

FOREIGN PATENT DOCUMENTS

EP 1186213 3/2002

(Continued)

*Primary Examiner*—Benny Lee
(74) *Attorney, Agent, or Firm*—Wood, Herron & Evans, LLP

(57) ABSTRACT

A multi-layer printed circuit board includes a first conductive layer including at least one conductor pattern and a plated through hole extending into the first conductive layer and intersecting the conductor pattern. A current diverting cutout in the conductor pattern is positioned proximate the intersection of the plated through hole and conductor pattern.

17 Claims, 2 Drawing Sheets

U.S. PATENT DOCUMENTS

| | | | |
|---|---|---|---|
| 2001/0030588 A1* | 10/2001 | Son et al. | 333/203 |
| 2001/0039729 A1 | 11/2001 | Ross | |
| 2001/0045011 A1 | 11/2001 | Ross | |
| 2002/0050407 A1 | 5/2002 | Sohn | |
| 2003/0036349 A1 | 2/2003 | Wu | |
| 2003/0087498 A1 | 5/2003 | Galvagni | |
| 2004/0003942 A1 | 1/2004 | Zhang et al. | |
| 2004/0053014 A1 | 3/2004 | Sato | |
| 2004/0070956 A1 | 4/2004 | Antu | |
| 2004/0150970 A1 | 8/2004 | Lee | |
| 2004/0162715 A1 | 8/2004 | Frank | |
| 2004/0238213 A1 | 12/2004 | Pitio | |
| 2005/0005438 A1 | 1/2005 | Durkot | |
| 2005/0029013 A1 | 2/2005 | Lee | |

FOREIGN PATENT DOCUMENTS

| | | |
|---|---|---|
| EP | 1190608 | 3/2002 |
| JP | 61167201 | 7/1986 |
| JP | 02043801 | 2/1990 |
| JP | 02094693 | 4/1990 |
| JP | 03187501 | 8/1991 |
| JP | 03218101 | 9/1991 |
| JP | 04014301 | 1/1992 |
| JP | 06338687 | 12/1994 |
| JP | 08264940 | 10/1996 |
| JP | 09321433 | 12/1997 |
| JP | 20000031652 | 1/2000 |
| JP | 2001244636 | 9/2001 |
| JP | 2002305377 | 10/2002 |
| WO | WO 8500929 | 2/1985 |
| WO | WO 9832224 | 7/1988 |
| WO | WO 9834343 | 8/1998 |
| WO | WO 0078104 | 12/2000 |
| WO | WO 2004107830 | 9/2004 |

\* cited by examiner

PRINTED WIRING BOARD ASSEMBLY WITH SELF-COMPENSATING GROUND VIA AND CURRENT DIVERTING CUTOUT

FIELD OF THE INVENTION

The invention relates generally to printed circuit and wiring boards and specifically to through hole connections between multiple layers of multi-layer boards.

BACKGROUND OF THE INVENTION

Printed circuit boards (PCB) and printed wiring boards (PWB) are used in a variety of circuits and electrical devices. Many such boards are multi-layer boards, wherein the boards have specific conductive circuit patterns and circuit traces and are arranged in a stacked configuration and interconnected to operate together.

One typical method of electrically connecting together the individual boards of a multiple board arrangement is by using plated through holes (PTH). Plated through holes are essentially holes that extend through the multiple layers and intersect the circuit patterns of the multiple layers. The through holes are plated, such as with a conductive metal, to electrically connect the circuit patterns of adjacent layers together. For example, one layer of a multi-layer arrangement might be fully metallized to act as a grounding layer or ground reference for the other layers of the board. Plated through holes are then positioned to extend from the ground layer to the circuit traces of another layer to provide a ground reference for those circuit traces.

Multi-layer PWBs are used for a variety of RF applications, such as to form RF filters and amplifier circuits that are used for a variety of various RF communication applications. In a typical design, a top and bottom conductor layer might sandwich a middle conductor layer that contains multiple conductor patterns. Interposed dielectric layers separate the conductive layers from each other, both physically and electrically. Plated through holes extend through the conductor layers and dielectric layers and intersect the conductor traces of the pattern of the middle layer. The plated through holes form a conductive interconnection between the traces of the middle layer and the top and bottom conductor layers.

FIG. 1 illustrates one typical multi-layer assembly 10. The assembly 10 forms an RF circuit called an interdigital filter. The filter 10 includes a top conductive layer 12, a bottom conductive layer 16 and a middle conductive layer 14 that includes a circuit pattern that includes multiple traces 20. Dielectric layers 13, 15 separate the conductive layers 12, 14, 16. The traces 20, which form resonators in the filter 10, are coupled at ends thereof to the conductive layers 12, 16 by plated through holes 22 that are sometimes referred to as plated vias. In the case of the filter 10, if the top and bottom conductive layers are grounded, the plated through holes act to ground the selected ends of the resonator traces 20. At RF frequencies, the traces 20 arranged as shown and grounded by the through holes, operate as an RF filter element. Signals at input trace 24 are filtered and output at the output trace 26.

In the filter example of FIGS. 1 and 2, the resonator traces 20 and PTH vias 22 are used to create resonator elements for the filter. To that end, it is very important to have proper alignment between the PTH vias that extend through all of the multiple layers and the respective resonator patterns that are intersected by the vias. Any errors in the registration of the PTH vias with respect to their positioning and intersection with the resonator patterns is undesirable because such errors cause undesirable differences in the resonant frequencies of the subject resonators 20 of the filter 10.

One particular problem in such a multi-layer PWB component design is the fact that the PTH grounding vias are normally added to a PWB device after all layers are bonded together. Referring again to FIG. 1, such a view shown is essentially an "x-ray" view showing the middle layer. However, in reality when the solid conductive layers 12, 16 and dielectric 13, 15 layers are assembled, it is very difficult to accurately locate the PTH vias with respect to the resonator pattern 20 because direct visual reference to the pattern 20 on the middle conductive layer 14 is blocked or covered by the upper dielectric layer 13 and top conductive layer 12. Errors in the absolute position of the PTH grounding vias may cause unacceptable tuning errors in the filter. FIG. 2 shows a typical single resonator conductor pattern and its PTH ground via.

Therefore, there is a need in the art to address problems in the fabrication of multi-layer PCB and PWB devices, and specifically to address the need for PTH placement wherein direct visual references are obstructed. There is a particular need to address positioning of PTH grounding vias in such multi-layer designs which form circuits that are susceptible to degradations and errors resulting from registration errors between the PTH vias and conductor patterns. These needs and others are addressed by the invention.

BRIEF DESCRIPTION OF THE DRAWINGS

The accompanying drawings, which are incorporated in and constitute a part of this specification, illustrate embodiments of the invention and, together with the detailed description of the embodiments given below, serve to explain the principles of the invention.

DETAILED DESCRIPTION OF THE EMBODIMENTS OF THE INVENTION

As noted above, FIG. 1 illustrates a printed wiring board structure that has a typical multi-layer design. FIG. 2 is a closer view of a conductor pattern in such a multi-layer PWB design utilizing a plated through hole. The present invention addresses various of the drawbacks in the prior art including those noted above by utilizing a current diverting cut-out in the conductor pattern that addresses problems caused by misalignment errors.

Figure 1:
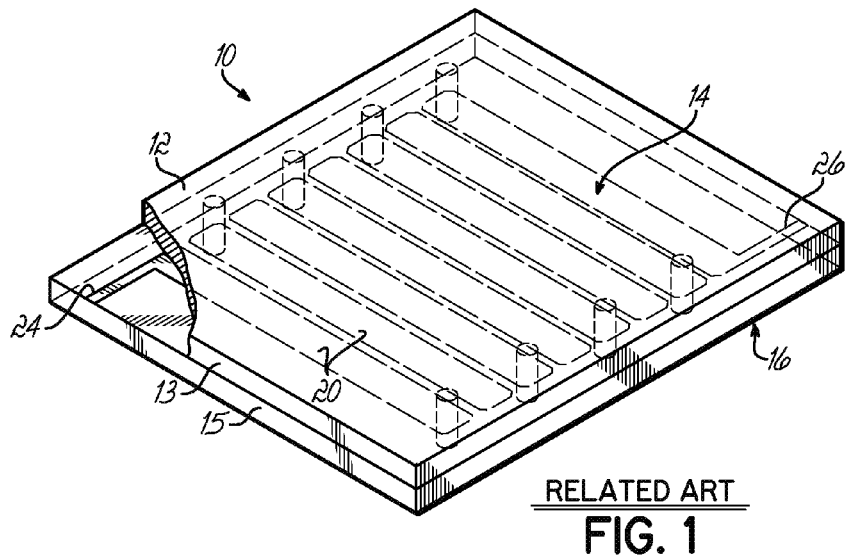
FIG. 1 is a perspective view, in partial section, of the related art of a printed wiring board device implementing a filter with which the invention might be utilized.
Figure 2:
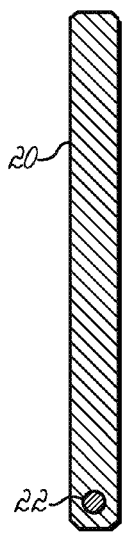
FIG. 2 illustrates a conductor pattern showing a plated through hole via in the pattern with which the invention might be utilized.
Figure 3:
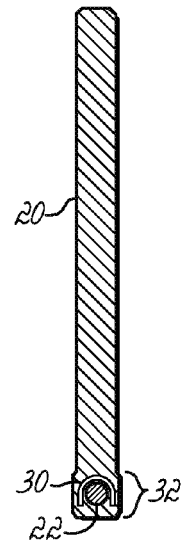
FIG. 3 is a top view of a conductor pattern with the plated through hole incorporating the present invention.

Referring to FIG. 3, a conductor pattern 20, similar to that illustrated in FIGS. 1 and 2, is shown. The plated through hole 22 is positioned to intersect at one end of the conductor pattern 20. In the specific PWB example discussed herein, the conductor patterns are utilized in the PWB device to form multiple resonators of an interdigital filter. It should be understood by a person of ordinary skill in the art that multi-layer PWBs may be utilized to form any number of different circuits, including different RF circuits for various applications.

Therefore, the present invention is not simply limited to use with the disclosed filter design.

Figure 4:
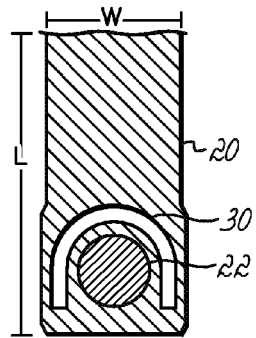
FIG. 4 is a closer top view of a conductor pattern with the plated through hole incorporating the present invention.

A current diverting cutout 30 is illustrated in FIGS. 3 and 4. The current diverting cutout 30 is positioned proximate the area where the plated through hole intersects the conductor pattern. Conductive material is removed from pattern 20, such as by being etched away or not deposited when the pattern 20 is laid down on layer 14 (e.g. see FIG. 1), in order to form the current diverting cutout 30. For the resonator pattern 20 illustrated in FIG. 3, the area of intersection is designated with numeral 32 and is approximately at the end of the resonator pattern 20. As noted above, the plated through hole 22 may also intersect a top conductive layer 12 or a bottom conductive layer 16 or some other conductive layer. In the disclosed embodiment, the plated through holes are utilized to provide grounding vias, or grounding points, for the various conductor patterns (resonators) 20. Although discussed herein as grounding vias, the plated through holes might also provide other signal references and signal to the conductor patterns 20.

Figure 5:
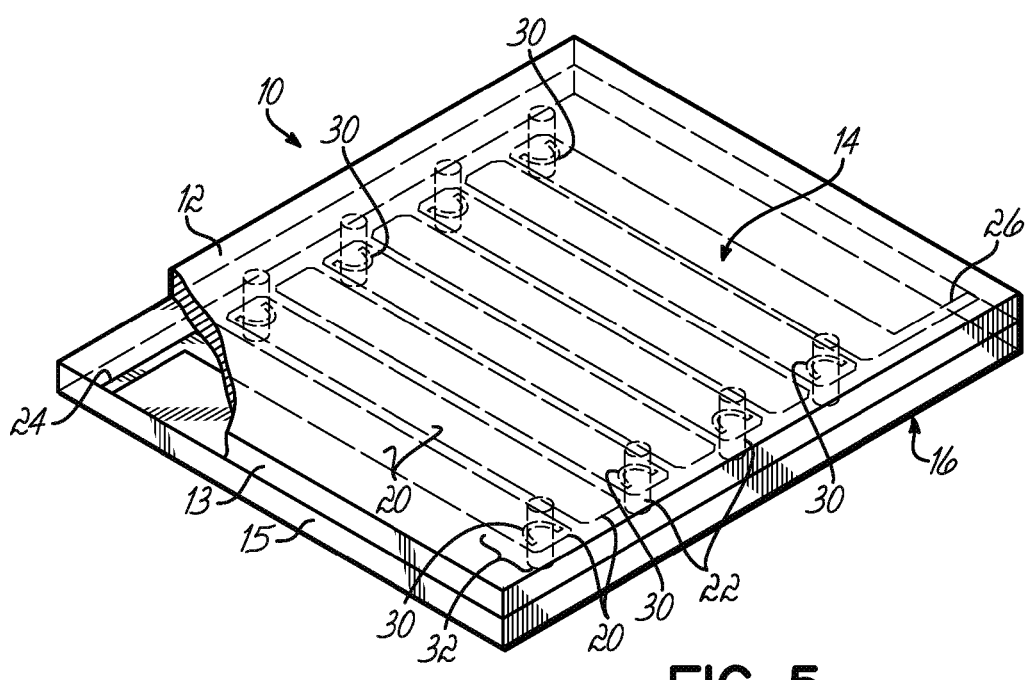
FIG. 5 is a perspective view of a printed wiring board utilizing the present invention in a filter design.

To provide a grounding reference, the plated through holes of the device shown in FIGS. 1 and 5 intersect not only the first conductive layer, which is illustrated as a middle conductive layer 14 and includes the conductor patterns 20, but also intersects the second and third conductive layers that overlie and underlie the middle conductive layer. For example, the plated through holes 22 intersect a top conductive layer 12 and a bottom conductive layer 16.

In one aspect of the present invention, the current diverting cut-outs 30 create an electrical connection between the respective conductor pattern 20 and the plated through hole 22 that has at least one of a capacitive and/or inductive component. Those capacitive or inductive components are reflective of the location of the plated through hole 20 with respect to the conductor pattern 20 and also with respect to the current diverting cut-out 30. Particularly, the current diverting cut-out 30 creates an electrical connection at the plated through hole 22 and the end area 32 of the conductor pattern or resonator 22 that has capacitive and inductive components that vary, in an opposing manner, as the physical location of the plated through hole varies with respect to conductor pattern 20.

Referring to FIG. 4, for example, if the plated through hole 22 varies from side to side with respect to the width W of the conductor pattern 20 or varies along the length L, but stays within normal error ranges for the placement of the plated through hole, the electrical connection of the conductor pattern 20 to the plated through hole 22 has capacitive and inductive components that change in an opposing manner. The cutouts 30 prevent undesirable electrical characteristics of the conductor pattern 20 due to misalignment between the patterns 20 and a respective plated through hole 22. In the filter example described herein, addressing the variation in the physical location of the plated through hole vias 22 within normal error ranges prevents differences in the resonant frequencies of the subject resonators 20. FIG. 5 illustrates a PWB structure in the form of a filter similar to FIG. 1 with some similar reference numbers for similar components, as set forth above, with respect to FIG. 1, and thus, is not described in detail in FIG. 5, but utilizing the current diverting cutouts 30 at the various areas 32 indicating the electrical connection between the plated through holes 22 and the resonators 20.

The current diverting cut-outs 30 of the present invention may have various shapes that will ensure the desired opposing capacitive and inductive interaction based upon the positioning of the plated through holes 22 and the conductor pattern 20. In the example illustrated in FIGS. 3, 4, and 5, the current diverting cut-out is shaped to partially surround the plated through hole 20 at the intersection area 32. More specifically, the current diverting cut-out 30 is semi-circular in shape to partially surround the plated through hole having a generally circular cross-section. Of course, plated through holes with other cross-sectional shapes might also be utilized and the current diverting cut-out 30 would be reflective of such a shape to ensure the opposing interactive capacitive and inductive characteristics of the current diverting cut-out based on the position of the plated via with respect to the conductor patterns to which it connects.

Thus, the present invention is utilized in a filter as shown in FIG. 5, for example, and prevents undesirable errors or differences in resonant frequencies of the various filter resonators and, thus, prevents unacceptable tuning errors in the filter. Furthermore, the present invention eliminates the concern over the difficulty in accurately locating the vias with respect to the conductor patterns because of a lack of a direct and visual reference to those conductor patterns that are hidden, such as in a middle layer of a multi-layer PWB structure.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. A multi-layer printed circuit board comprising:
a first conductive layer including at least one conductor pattern defining a circuit element;
a second conductive layer defining a ground plane with respect to the first conductive layer and the circuit element;
the second conductive layer overlying the first conductive layer;
a plated through hole extending between the first conductive layer and the second conductive layer and intersecting the at least one conductor pattern to couple the circuit element to the ground plane;
a current diverting cutout disposed in the circuit element and positioned proximate the intersection of the plated through hole and the at least one conductor pattern.

2. The multi-layer printed circuit board of claim 1 wherein the circuit element of the at least one conductor pattern includes a resonator element of a filter.

3. The multi-layer printed circuit board of claim 1 wherein the current diverting cutout creates an electrical connection between the circuit element and the plated through hole that has at least one of capacitive and inductive components that are reflective of the location of the plated through hole with respect to the at least one conductor pattern.

4. The multi-layer printed circuit board of claim 3 wherein the at least one of capacitive and inductive components of the electrical connection vary, in an opposing manner, as the physical location of the plated through hole varies on the at least one conductor pattern.

5. A method of forming a multi-layer printed circuit board comprising:
providing a first conductive layer and including at least one conductor pattern to form a circuit element in that first conductive layer;

forming a ground plane with a second conductive layer to overlie the first conductive layer and the circuit element;

forming a plated through hole to extend between the first and second conductive layers and to intersect the circuit element to couple the circuit element to the ground plane;

positioning a current diverting cutout in the circuit element proximate to where the plated through hole intersects the pattern circuit element;

forming the current diverting cutout to have a shape to partially surround the plated through hole.

6. The method of claim 5 wherein the current diverting cutout creates an electrical connection between the circuit element and plated through hole that has at least one of capacitive and inductive components that are reflective of the location of the plated through hole with respect to the at least one conductor pattern.

7. The method of claim 6 wherein the at least one of capacitive and inductive components of the electrical connection vary, in an opposing manner, as the physical location of the plated through hole varies on the circuit element.

8. An RF filter device comprising:
a first conductive layer including at least one resonator and a second conductive layer at least partially covering the at least one resonator of the first conductive layer;
the second conductive layer overlying one side of the first conductive layer;
a plated through hole extending between the first conductive layer and the second conductive layer and intersecting the at least one resonator to couple the at least one resonator to the second conductive layer;
a current diverting cutout disposed in the at least one resonator and positioned proximate the intersection of the plated through hole and the at least one resonator.

9. The RF filter device of claim 8 further comprising a third conductive layer located relative to the first conductive layer on an opposite side from the second conductive layer.

10. The RF filter device of claim 8 wherein the current diverting cutout creates an electrical connection between the at least one resonator and plated through hole that has at least one of capacitive and inductive components that are reflective of the location of the plated through hole with respect to the at least one resonator.

11. The RF filter device of claim 10 wherein the at least one of capacitive and inductive components of the electrical connection vary, in an opposing manner, as the physical location of the plated through hole varies.

12. An RF filter device comprising:
a first conductive layer including at least one resonator and a second conductive layer at least partially covering at least one resonator of the first conductive layer;
a plated through hole extending between the first conductive layer and the second conductive layer and intersecting the at least one resonator to couple the at least one resonator to the second conductive layer;
a current diverting cutout disposed in the at least one resonator and positioned proximate the intersection of the plated through hole and the at least one resonator;
the current diverting cutout having a shape to partially surround the plated through hole at the intersection.

13. The RF filter device of claim 12 wherein the current diverting cutout is semi-circular in shape to partially surround the plated through hole.

14. A method of forming an RF filter device comprising:
providing a first conductive layer and including at least one resonator in that first conductive layer;
providing a second conductive layer to define a ground plane with respect to the first conductive layer and the at least one resonator;
the second conductive layer overlying the first conductive layer;
forming a plated through hole to extend between the first and second conductive layers, and to intersect the at least one resonator;
positioning a current diverting cutout in the at least one resonator proximate to where the plated through hole intersects the at least one resonator.

15. The method of claim 14 wherein the current diverting cutout creates an electrical connection between the at least one resonator and plated through hole that has capacitive and inductive components that vary, in an opposing manner, as the physical location of the plated through hole varies with respect to the at least one resonator.

16. A multi-layer printed circuit board comprising:
a first conductive layer including at least one conductor pattern defining a circuit element;
a second conductive layer defining a ground plane with respect to the first conductive layer and the circuit element;
a plated through hole extending between the first conductive layer and the second conductive layer and intersecting the at least one conductor pattern to couple the circuit element to the ground plane;
a current diverting cutout disposed in the circuit element and positioned proximate the intersection of the plated through hole and at least one conductor pattern;
the current diverting cutout having a shape to partially surround the plated through hole at the intersection.

17. The multi-layer printed circuit board of claim 16 wherein the current diverting cutout is semi-circular in shape to partially surround the plated through hole.

* * * * *